(12) United States Patent
Liu

(10) Patent No.: US 9,917,111 B2
(45) Date of Patent: Mar. 13, 2018

(54) ELECTRODE LEAD-OUT STRUCTURE, ARRAY SUBSTRATE AND DISPLAY DEVICE

(71) Applicant: BOE TECHNOLOGY GROUP CO., LTD., Beijing (CN)

(72) Inventor: Xiang Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/422,829

(22) PCT Filed: May 23, 2014

(86) PCT No.: PCT/CN2014/078269
§ 371 (c)(1),
(2) Date: Feb. 20, 2015

(87) PCT Pub. No.: WO2015/096371
PCT Pub. Date: Jul. 2, 2015

(65) Prior Publication Data
US 2016/0043101 A1    Feb. 11, 2016

(30) Foreign Application Priority Data

Dec. 24, 2013 (CN) .......................... 2013 1 0722613

(51) Int. Cl.
*H01L 27/12* (2006.01)
*H01L 27/32* (2006.01)
(Continued)

(52) U.S. Cl.
CPC ........ *H01L 27/124* (2013.01); *H01L 23/5226* (2013.01); *H01L 27/12* (2013.01);
(Continued)

(58) Field of Classification Search
CPC ... H01L 29/7869; H01L 29/45; H01L 29/518; H01L 29/78606; H01L 29/786;
(Continued)

(56) References Cited

U.S. PATENT DOCUMENTS 7,220,611 B2\*   5/2007   Chang ................. G02F 1/13458
                                                             257/59
2008/0291350 A1\*  11/2008  Hayashi .............. H01L 27/1225
                                                             349/47
(Continued)

FOREIGN PATENT DOCUMENTS

| CN | 1291348 A | 4/2001 |
| CN | 1440080 A | 9/2003 |

(Continued)

OTHER PUBLICATIONS

Search Report issued in International Application No. PCT/CN2014/078269, dated May 23, 2014 (May 23, 2014).

(Continued)

*Primary Examiner* — Natalia Gondarenko
(74) *Attorney, Agent, or Firm* — Nath, Goldberg & Meyer; Joshua B. Goldberg; Stanley N. Protigal

(57) ABSTRACT

The present invention belongs to the field of display technology and particularly relates to an electrode lead-out structure, an array substrate and a display device. The electrode lead-out structure comprises a substrate electrode, an isolating layer and an lead-out electrode. The isolating layer covers the substrate electrode to expose a part of region of the substrate electrode through a via formed in the isolating layer, and the lead-out electrode is in contact with the exposed region of the substrate electrode, wherein the lead-out electrode covers the wall and bottom of the via of the isolating layer and extends from an upper edge of the via (Continued)

of the isolating layer along an upper surface of the isolating layer to overlap with the upper layer of the isolating layer.

12 Claims, 4 Drawing Sheets

(51) Int. Cl.
*H01L 29/66* (2006.01)
*H01L 23/522* (2006.01)
*H01L 23/52* (2006.01)

(52) U.S. Cl.
CPC .... *H01L 27/1225* (2013.01); *H01L 29/66969* (2013.01); *H01L 2924/0002* (2013.01)

(58) Field of Classification Search
CPC .......... H01L 29/4908; H01L 21/02554; H01L 21/441; H01L 21/02565; H01L 21/47573; H01L 29/41733; H01L 29/78696; H01L 29/42384; H01L 33/44; H01L 33/52; H01L 28/60; H01L 51/0023; H01L 51/5234; H01L 51/5237; H01L 51/5253; H01L 21/283–21/2885; H01L 23/485; H01L 23/4855; H01L 23/522–23/53295; H01L 21/76877; H01L 21/76879–21/76883; H01L 21/76897; H01L 27/12–27/1255; H01L 27/1259–27/1296; H01L 2021/775; H01L 27/32–27/3293; H01L 29/66969; H01L 2924/0002; G02F 1/136; G02F 1/13685
USPC ..... 257/43, 98, 99, 59, 60, 72, 89, E29.151; 438/34, 30, 33
See application file for complete search history.

(56) References Cited

U.S. PATENT DOCUMENTS

| | | | |
|---|---|---|---|
| 2009/0284677 A1 | 11/2009 | Shin et al. | |
| 2010/0032848 A1* | 2/2010 | Philippsen | H01L 23/525 257/779 |
| 2010/0301327 A1* | 12/2010 | Kang | G02F 1/1333 257/43 |
| 2011/0127531 A1* | 6/2011 | Kim | H01L 29/41733 257/59 |
| 2012/0043545 A1 | 2/2012 | Kim et al. | |
| 2012/0074414 A1 | 3/2012 | Lee et al. | |
| 2013/0207101 A1* | 8/2013 | Yamazaki | H01L 29/41733 257/43 |
| 2013/0286314 A1* | 10/2013 | Yoshida | G02F 1/136227 349/43 |
| 2015/0214255 A1* | 7/2015 | Chikama | H01L 29/66765 257/43 |

FOREIGN PATENT DOCUMENTS

| | | | | |
|---|---|---|---|---|
| CN | 1945848 A | | 4/2007 | |
| CN | 101213655 A | | 7/2008 | |
| CN | 102651340 A | | 8/2012 | |
| CN | 102709239 A | | 10/2012 | |
| CN | 103219389 A | | 7/2013 | |
| CN | 103367248 A | | 10/2013 | |
| CN | 103681696 A | | 3/2014 | |
| JP | 2000-340653 A | | 12/2000 | |
| JP | 2012190647 A | * | 8/2012 | |
| WO | WO 2014034512 A1 | * | 3/2014 | ....... H01L 29/66765 |

OTHER PUBLICATIONS

First Office Action dated Sep. 2, 2015 corresponding to Chinese application No. 201310722613.1.
Written Opinion of the International Searching Authority dated May 23, 2014 corresponding to International application No. PCT/CN2014/078269.
Office Action dated Feb. 19, 2016 issued in corresponding Chinese Application No. 201310722613.1.
Fourth Office Action dated Jan. 20, 2017 in corresponding Chinese Application No. 201310722613.1.

* cited by examiner

US 9,917,111 B2

1

ELECTRODE LEAD-OUT STRUCTURE, ARRAY SUBSTRATE AND DISPLAY DEVICE

CROSS-REFERENCE TO RELATED APPLICATION

This is a National Phase Application filed under 35 U.S.C. 371 as a national stage of PCT/CN2014/078269 filed on May 23, 2014, an application claiming the benefit to Chinese application No. 201310722613.1 filed on Dec. 24, 2013; the content of each of which is hereby incorporated by reference in its entirety.

FIELD OF THE INVENTION

The present invention belongs to the field of display technology, and particularly relates to an electrode lead-out structure, an array substrate and a display device.

BACKGROUND OF THE INVENTION

With the development of science and technology, panel display devices have been widely applied in people's daily lives. At present, common panel display devices include LCD (Liquid Crystal Display) devices and OLED (Organic Light-Emitting Diode) display devices. Particularly, with the characteristics of small size, light weight, small thickness, low power consumption, no radiation and so on, LCD panel display devices have been developed rapidly recently, and holds a dominant position in the current market of panel display devices.

Wherein, both LCD and OLED display devices are provided therein with thin film transistors (TFTs for short). As driving elements, TFTs play a crucial role in the LCD and OLED display devices. Recently, the panel display technology has been developed rapidly, and the size and resolution of a display device are continuously improved. Large-size and high-resolution display devices have become a main trend. In order to adapt to the continuously increased size and continuously improved resolution, it is necessary to employ higher-frequency driving circuits to avoid the delay of control signals and image signals. At present, the signal delay has become one of key factors constraining the display effects of large-size and high-resolution panels.

To improve the frequency of a driving circuit, multiple improvements have been made with respect to materials for preparing the TFTs. Researches show that the mobility of the most common thin film transistors currently prepared from amorphous silicon is yet difficult to meet the driving requirements. For example, the mobility of an amorphous silicon thin film transistor is generally about 0.5 cm$^2$/v·s, but for an LCD having a size more than 80 inches and driving frequency of 120 Hz, it is required to have mobility of above 1 cm$^2$/v·s. Although polycrystalline silicon thin film transistors have been researched earlier, the polycrystalline silicon thin film transistors have poor homogeneity and complicated production process. In contrast, metal oxide semiconductors are new materials for preparing TFTs. The metal oxide TFTs having high mobility, good homogeneity, simple production process and low cost are suitable for large-scale film formation and very suitable for large-size panel display technologies, and may better meet the requirements for large size and high refresh frequency of LCD and OLED display devices.

Among the metal oxide semiconductors, the indium-gallium-zinc oxide (IGZO) semiconductor is researched mostly at present. The IGZO is generally of an amorphous structure and is very likely to be etched by an acid solution. In a TFT structure, electrodes are generally formed by using Mo, Al or other metals. During an electrode preparation process, a corresponding layer structure pattern is formed by etching with a use of an acid solution. As a result, it is unavoidable to corrode the metal oxide semiconductors during the electrode formation process. Therefore, it is necessary to add an etching barrier layer between a metal semiconductor layer and an electrode to protect the metal oxide semiconductor from being corroded by the etching solution for forming the electrode pattern.

Moreover, the metal oxide semiconductors are very sensitive to water and oxygen ($H_2O$ and $O_2$) in the environment. If the water and oxygen are diffused into the metal oxide semiconductor TFTs, the electrical properties of the TFTs will be changed. As a result, the stability and reliability of the metal oxide semiconductors are directly influenced, the properties of TFTs are sharply worsen, and the display effect of display devices is thus influenced.

At present, in an array substrate (Array) with a TFT matrix formed therein, in order to ensure the normal formation of TFT channels, it is required to form vias in an etching barrier layer to allow an lead-out electrode to come into contact with the metal oxide semiconductor serving as a substrate electrode. The formation of the vias possibly allows water and oxygen to permeate inside TFTs along clearances of the vias, thereby influencing the metal oxide semiconductor. In addition, to provide convenience for access of a display signal and access of a test signal, a source data signal input terminal (e.g., a via lap joint in an SD region of the non-display region as shown in FIG. 1), SD PAD of a source connecting plate (e.g., an SD PAD region serving as a bridge between a source data signal and a source driving circuit in the non-display region as shown in FIG. 2), a gate scanning signal input terminal (e.g., a via lap joint in a Gate region of the non-display region as shown in FIG. 3) and a gate connecting plate Gate PAD (e.g., a Gate PAD region serving as a bridge between a gate scanning signal and a gate driving circuit in the non-display region as shown in FIG. 4) are further provided within a non-display region. In all the above electrode connection of the display region and the signal input terminals and PAD structures in the non-display region, a substrate electrode on the bottom and an insulating layer above the substrate electrode are included. The lead-out electrode is merely led out from the substrate electrode to the surface of the insulating layer. As a part of hole wall or layer wall is still exposed in air when the lead-out electrode is electrically connected to the metal oxide semiconductor serving as the substrate electrode through the via in the insulating layer or along the wall of the insulating layer, outside water and oxygen are likely to permeate inside TFTs through the clearances of the vias and then are diffused into the metal oxide semiconductor layer, so that the stability of the metal oxide semiconductor TFTs is influenced.

SUMMARY OF THE INVENTION

In view of the problems in the prior art, a technical problem to be solved by the present invention is to provide an electrode lead-out structure, an array substrate and a display device. The electrode lead-out structure is of an overlapped structure and can keep structure layers underneath an isolating layer well sealed.

One aspect of the technical solutions employed to solve the technical problem relates to an electrode lead-out structure, including a substrate electrode, an isolating layer and an lead-out electrode, the isolating layer covering the substrate electrode in such a manner that a part of region of the substrate electrode is exposed through a via formed in the isolating layer or a side wall at an end portion of the isolating layer, the lead-out electrode being in contact with the substrate electrode through the exposed region of the substrate electrode, wherein: the lead-out electrode covers the wall and bottom of the via of the isolating layer, and the lead-out electrode also extends from an upper edge of the via of the isolating layer along the upper surface of the isolating layer to overlap with an upper surface of the isolating layer; or, the lead-out electrode covers the side wall at the end portion of the isolating layer, and the lead-out electrode also extends from an upper edge of the side wall at the end portion of the isolating layer along the upper surface of the isolating layer to overlap with the upper surface of the isolating layer and extends from a lower edge of the side wall at the end portion of the isolating layer along the exposed region of the substrate electrode to overlap with the exposed region of the substrate electrode.

Optionally, a radius of a range in which the lead-out electrode overlaps with the upper surface of the isolating layer by extending from the upper edge of the via of the isolating layer along the upper surface of the isolating layer is 0.2-200 μm; or, a radius of a range in which the lead-out electrode overlaps with the upper surface of the isolating layer by extending from the upper edge of the side wall at the end portion of the isolating layer along the upper surface of the isolating layer is 0.2-200 μm.

An array substrate is provided, including a substrate and an electrode lead-out structure disposed on the substrate, wherein the electrode lead-out structure employs the electrode lead-out structure described above.

Optionally, the array substrate includes a display region and a non-display region, and the electrode lead-out structure is disposed in the display region and/or non-display region of the array substrate.

As a preferred solution, a plurality of pixel units are provided in the display region, each of the pixel units including a gate, a gate insulating layer, an active layer, an etching barrier layer, a source and a drain, the substrate electrode including the active layer, the lead-out electrode including the source and the drain, the isolating layer including the etching barrier layer, a first etching barrier layer via and a second etching barrier layer via being formed in the etching barrier layer to respectively expose a part of region of the active layer, the source being in contact with the active layer through the exposed region of the active layer, the drain being in contact with the active layer through the exposed region of the active layer; wherein, the source covers the wall and bottom of the first etching barrier layer via, and the source also extends from an upper edge of the first etching barrier layer via along an upper surface of the etching barrier layer to overlap with the upper surface of the etching barrier layer; and/or, the drain covers the wall and bottom of the second etching barrier layer via, and the drain also extends from an upper edge of the second etching barrier layer via along the upper surface of the etching barrier layer to overlap with the upper surface of the etching barrier layer.

Optionally, a radius of a range in which the source overlaps with the upper surface of the etching barrier layer by extending from the upper edge of the first etching barrier layer via along the upper surface of the etching barrier layer is 0.2-8 μm; and/or, a radius of a range in which the drain overlaps with the upper surface of the etching barrier layer by extending from the upper edge of the second etching barrier layer via along the upper surface of the etching barrier layer is 0.2-8 μm.

Optionally, each of the pixel units further includes a passivation layer and a pixel electrode, the lead-out electrode further includes the pixel electrode, the isolating layer further includes the passivation layer, the passivation layer covers the source and the drain in such a manner that a part of region of the drain is exposed through a via formed in the passivation layer, and the pixel electrode is in contact with the drain through the exposed region of the drain, wherein: the pixel electrode covers the wall and bottom of the via of the passivation layer, and the pixel electrode also extends from an upper edge of the via of the passivation layer along an upper surface of the passivation layer to overlap with the upper surface of the passivation layer.

Optionally, a radius of a range in which the pixel electrode overlaps with the upper surface of the passivation layer by extending from the upper edge of the via of the passivation layer along the upper surface of the passivation layer is 2-200 μm.

As a preferred solution, an electrode connecting plate is provided within the non-display region, the electrode connecting plate including a wiring electrode, an electrode protection layer and a signal lead-out electrode, the substrate electrode including the wiring electrode, the lead-out electrode including the signal lead-out electrode, the isolating layer including the electrode protection layer, the electrode protection layer covering the wiring electrode in such a manner that a part of region of the wiring electrode is exposed through a side wall at an end portion of the electrode protection layer or a via formed in the electrode protection layer, the signal lead-out electrode being in contact with the wiring electrode through the exposed region of the wiring electrode, wherein: the signal lead-out electrode covers the side wall at the end portion of the electrode protection layer, and the signal lead-out electrode also extends from an upper edge of the side wall at the end portion of the electrode protection layer along an upper surface of the electrode protection layer to overlap with the upper surface of the electrode protection layer, and extends from a lower edge of the side wall at the end portion of the electrode protection layer along the exposed region of the wiring electrode to overlap with the exposed region of the wiring electrode; or, the signal lead-out electrode covers the wall and bottom of the via of the electrode protection layer, and the signal lead-out electrode extends from an upper edge of the via at the electrode protection layer along the upper surface of the electrode protection layer to overlap with the upper surface of the electrode protection layer.

Optionally, a radius of a range in which the signal lead-out electrode overlaps with the upper surface of the electrode protection layer by extending from the upper edge of the side wall at the end portion of the electrode protection layer along the upper surface of the electrode protection layer is 2-200 μm; or, a radius of a range in which the signal lead-out electrode overlaps with the upper surface of the electrode protection layer by extending from the upper edge of the via of the electrode protection layer along the upper surface of the electrode protection layer is 2-200 μm.

Optionally, the wiring electrode is formed by using the same material and in the same patterning process as the drain, the signal lead-out electrode is formed by using the same material and in the same patterning process as the pixel electrode, and the electrode protection layer is formed by using the same material and in the same patterning process as the passivation layer.

Optionally, the electrode protection layer includes a first electrode protection layer and a second electrode protection layer, and the signal lead-out electrode includes a first signal lead-out electrode and a second signal lead-out electrode, wherein: the first electrode protection layer covers the wiring electrode in such a manner that a part of region of the wiring electrode is exposed through a side wall at an end portion of the first electrode protection layer, the first signal lead-out electrode being in contact with the wiring electrode through the exposed region of the wiring electrode, the first signal lead-out electrode covering the side wall at the end portion of the first electrode protection layer, the first signal lead-out electrode also extending from an upper edge of the side wall at the end portion of the first electrode protection layer along an upper surface of the first electrode protection layer to overlap with the upper surface of the first electrode protection layer, and extending from a lower edge of the side wall at the end portion of the first electrode protection layer along the exposed region of the wiring electrode to overlap with the exposed region of the wiring electrode; and the second electrode protection layer covers the first signal lead-out electrode in such a manner that a part of region of the first signal lead-out electrode is exposed through a side wall at an end portion of the second electrode protection layer, the second signal lead-out electrode being in contact with the first signal lead-out electrode through the exposed region of the first signal lead-out electrode, the second signal lead-out electrode covering the side wall at the end portion of the second electrode protection layer, the second signal lead-out electrode also extending from an upper edge of the side wall at the end portion of the second electrode protection layer along an upper surface of the second electrode protection layer to overlap with the upper surface of the second electrode protection layer, and extending from a lower edge of the side wall at the end portion of the second electrode protection layer along the exposed region of the first signal lead-out electrode to overlap with the exposed region of the first signal lead-out electrode; or wherein: the first electrode protection layer covers the wiring electrode in such a manner that a part of region of the wiring electrode is exposed through a via formed in the first electrode protection layer, the first signal lead-out electrode being in contact with the wiring electrode through the exposed region of the wiring electrode, the first signal lead-out electrode covering the wall and bottom of the via of the first electrode protection layer, the first signal lead-out electrode extending from an upper edge of the via of the first electrode protection layer along an upper surface of the first electrode protection layer to overlap with the upper surface of the first electrode protection layer; and the second electrode protection layer covers the first signal lead-out electrode in such a manner that a part of region of the first signal lead-out electrode is exposed through a via formed in the second electrode protection layer, the second signal lead-out electrode being in contact with the first signal lead-out electrode through the exposed region of the first signal lead-out electrode, the second signal lead-out electrode covering the wall and bottom of the via of the second electrode protection layer, the second signal lead-out electrode extending from an upper edge of the via of the second electrode protection layer along an upper surface of the second electrode protection layer to overlap with the upper surface of the second electrode protection layer.

Optionally, a radius of a range in which the first signal lead-out electrode overlaps with the upper surface of the first electrode protection layer by extending from the upper edge of the side wall at the end portion of the first electrode protection layer along the upper surface of the first electrode protection layer and a radius of a range in which the second signal lead-out electrode overlaps with the upper surface of the second electrode protection layer by extending from the upper edge of the side wall at the end portion of the second electrode protection layer along the upper surface of the second electrode protection layer are both 2-200 μm; or, a radius of a range in which the first signal lead-out electrode overlaps with the upper surface of the first electrode protection layer by extending from the upper edge of the via of the first electrode protection layer along the upper surface of the first electrode protection layer and a radius of a range in which the second signal lead-out electrode overlaps with the upper surface of the second electrode protection layer by extending from the upper edge of the via of the second electrode protection layer along the upper surface of the second electrode protection layer are both 2-200 μm.

Optionally, the wiring electrode is formed by using the same material and in the same patterning process as the gate, the first signal lead-out electrode is formed by using the same material and in the same patterning process as the drain, the second signal lead-out electrode is formed by using the same material and in the same patterning process as the pixel electrode, the first electrode protection layer is formed by the same material and in the same patterning process as the gate insulating layer, and the second electrode protection layer is formed by using the same material and in the same patterning process as the passivation layer.

Optionally, the active layer is formed from metal oxide semiconductor material; and the gate insulating layer, the etching barrier layer and the passivation layer are of a single-layer or multilayer structure and are formed from silicon-rich material, wherein the silicon-rich material includes silicon oxide, silicon nitride or silicon oxynitride.

A display device is provided, including the array substrate described above.

The present invention has the following advantages: in the electrode lead-out structure of an overlapped structure provided by the present invention and in the array substrate using the electrode lead-out structure, as the overlapped structure allows the concentration gradient of water and oxygen to gradually become smaller from outside to inside in the structure, the influences of outside water and oxygen permeated inside the array substrate on metal oxides may be effectively avoided, the TFTs (Oxide TFTs) with active layers formed by using metal oxide semiconductor have more stable performance and higher reliability, and the stability of the array substrate is also increased. The array substrate is particularly suitable for large-size and high-resolution liquid crystal display devices and AM-OLED display devices. Furthermore, the display device using the array substrate also has more stable performance and better display effect.

DETAILED DESCRIPTION OF THE EMBODIMENTS

Figure 1:
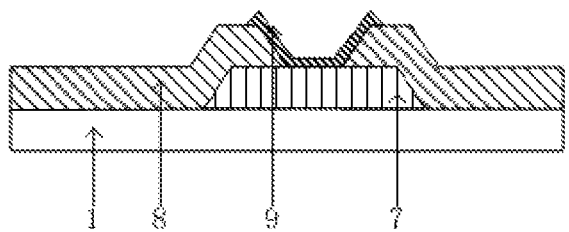
FIG. 1 is a sectional view of a via lap joint of an SD region of a non-display region in the prior art.

To make those skilled in the art better understand the technical solutions of the present invention, the electrode lead-out structure, the array substrate and the display device provided by the present invention will be further described as below in details with reference to the accompanying drawings and specific embodiments.

In the present invention, the photolithography process is a process of forming a pattern by using photoresist, a mask, an exposure machine and the like by exposure, developing, etching or other processes, and the patterning process includes photolithography, printing, ink-jetting or other processes for forming a predetermined pattern.

Embodiment 1

An electrode lead-out structure is provided, including a substrate electrode, an isolating layer and an lead-out electrode, the isolating layer covering the substrate electrode in such a manner that a part of region of the substrate electrode is exposed through a via formed in the isolating layer or a side wall at an end portion of the isolating layer, the lead-out electrode being in contact with the substrate electrode through the exposed region of the substrate electrode, wherein: the lead-out electrode covers the wall and bottom of the via of the isolating layer, and the lead-out electrode also extends from an upper edge of the via of the isolating layer along an upper surface of the isolating layer to overlap with the upper surface of the isolating layer; or, the lead-out electrode covers the side wall at the end portion of the isolating layer, and the lead-out electrode also extends from an upper edge of the side wall at the end portion of the isolating layer along the upper surface of the isolating layer to overlap with the upper surface of the isolating layer and extends from a lower edge of the side wall at the end portion of the isolating layer along the exposed region of the substrate electrode to overlap with the exposed region of the substrate electrode. That is, the lead-out electrode and the isolating layer form an overlapped structure.

According to different applications, the substrate electrode may be a gate, a source or a drain made of metal material, may also be an active layer made of metal oxide semiconductor material, or may further be a wiring electrode for transmitting scanning signals or data signals; the lead-out electrode may be a gate, a source or a drain made of metal material, may also be a pixel electrode made of metal oxide, or may further be a signal lead-out electrode for leading out scanning signals or data signals; and the isolating layer may be an etching barrier layer, a passivation layer or a protection layer. The preparation process of the lead-out electrode may be flexibly applied in a layer required for isolating water and oxygen, and will not be limited hereto.

A radius of a range in which the lead-out electrode overlaps with the upper surface of the isolating layer by extending from the upper edge of the via of the isolating layer along the upper surface of the isolating layer is 0.2-200 µm; or, a radius of a range in which the lead-out electrode overlaps with the upper surface of the isolating layer by extending from the upper edge of the wall at the end portion of the isolating layer along the upper surface of the isolating layer is 0.2-200 µm. Here, as the via is generally circular, the above radius of the range may be interpreted as a distance from the edge of the via of the isolating layer to the edge of the overlapped area of the lead-out electrode and the upper surface of the isolating layer; or, as the overlapped area is generally circular, and the radius of the range may be interpreted as a distance from the upper edge of the side wall at the end portion of the isolating layer to the edge of the overlapped area.

In this embodiment, in the electrode lead-out structure of an overlapped structure, by using the overlapped structure of the above lead-out electrode and the isolating layer, a clearance in a region of a via of the isolating layer is better blocked, so that a better sealing effect is realized to the structure layer underneath the isolating layer, and the defect of forming contact vias in the isolating layer and thus allowing water and oxygen to permeate into the inside structure is avoided.

Embodiment 2

This embodiment provides an array substrate, including a substrate and the electrode lead-out structure shown in Embodiment 1 disposed on the substrate.

Figure 5:
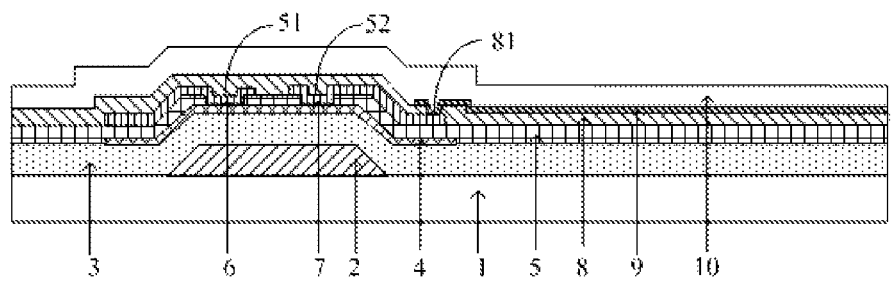
FIG. 5 is a sectional view of a display region of an array substrate in Embodiment 2 of the present invention.

Generally, the array substrate includes a display region and a non-display region. The electrode lead-out structure shown by this embodiment is disposed in the display region. The display region is provided therein with a plurality of pixel units. FIG. 5 shows a pixel unit in the display region of the array substrate according to this embodiment. The pixel unit includes a gate 2 disposed above the substrate 1, a gate insulting layer 3, an active layer 4, an etching barrier layer 5, a source 6 and a drain 7, wherein the active layer 4 is formed from metal oxide semiconductor material.

The electrode lead-out structure provided by this embodiment includes a substrate electrode, an lead-out electrode and an isolating layer, wherein the substrate electrode includes the active layer 4, the lead-out electrode includes the source 6 and the drain 7, and the isolating layer includes the etching barrier layer 5. A first etching barrier layer via 51 and a second etching barrier layer via 52 (as shown in FIG. 5, the first etching barrier layer via 51 is filled with the source 6, while the second etching barrier layer via 52 is filled with the drain 7; similar to the vias hereinafter) are formed in the etching barrier layer 5. The source 6 covers the wall and bottom of the first etching barrier layer via 51 and comes into contact with the active layer 4, while the drain 7 covers the wall and bottom of the second etching barrier layer via 52 and comes into contact with the active layer 4. Meanwhile, the source 6 extends from an upper edge of the first etching barrier layer via 51 along an upper surface of the etching barrier layer 5 to overlap with the upper surface of the etching barrier layer 5, and/or the drain 7 extends from an upper edge of the second etching barrier layer via 52 along an upper surface of the etching barrier layer 5 to overlap with the upper surface of the etching barrier layer 5. That is, the source 6 and the drain 7 are arranged in a manner of making the source 6 and the drain 7 be in contact with the active layer 4, and both the source 6 and the drain 7 may employ the above electrode lead-out structure, or any one of the source 6 and the drain 7 may employ the above electrode lead-out structure.

A radius of a range in which the source 6 overlaps with the upper surface of the etching barrier layer 5 by extending from the upper edge of the first etching barrier layer via 51 along the upper surface of the etching barrier layer 5 is 0.2-8 µm; and/or, a radius of a range in which the drain 7 overlaps with the upper surface of the etching barrier layer 5 by extending from the upper edge of the second etching barrier layer via 52 along the upper surface of the etching barrier layer 5 is 0.2-8 µm. Of course, according to the structure of TFTs, the radius of the range of the above overlap may be merely suitable for adjacent edges of the source 6 and the drain 7, while the other edges of the source 6 and the drain 7 may be designed according to the existing pattern schemes of the source 6 and the drain 7.

In this embodiment, the etching barrier layer 5 may be of a single-layer or multilayer structure and may be made of silicon-rich material, including silicon oxide, silicon nitride or silicon oxynitride, wherein the corresponding reactant gases of silicon oxide, silicon nitride or silicon oxynitride may be $N_2O$ and $SiH_4$; $N_2O$, $SiH_4$, $NH_3$ and $N_2$; $SiH_4$, $NH_3$ and $N_2$ or $SiH_2Cl_2$, $NH_3$ and $N_2$, where the range of the gas reaction ratio of $N_2O$ to $SiH_4$ is from 100:1 to 50:1.

In this embodiment, each of the pixel units further includes a passivation layer 8 and a pixel electrode 9. Therefore, the lead-out electrode further includes the pixel electrode 9, and the isolating layer further includes the passivation layer 8. The passivation layer 8 covers above the source 6 and the drain 7 to expose a part of region of the drain 7 through a via 81 of the passivation layer formed in a region corresponding to the drain 7. The pixel electrode 9 covers the wall and bottom of the via 81 of the passivation layer and comes into contact with the drain 7 through the exposed region. The pixel electrode 9 extends from an upper edge of the via 81 of the passivation layer along an upper surface of the passivation layer 8 to overlap with the upper surface of the passivation layer 8.

A radius of a range in which the pixel electrode 9 overlaps with the upper surface of the passivation layer 8 by extending from the upper edge of the via 81 of the passivation layer along the upper surface of the passivation layer 8 is 2-200 µm.

Similarly, the passivation layer 8 may be of a single-layer or multilayer structure and may be made of silicon-rich material. The silicon-rich material includes silicon oxide, silicon nitride or silicon oxynitride, wherein the corresponding reactant gases of silicon oxide, silicon nitride or silicon oxynitride may be $N_2O$ and $SiH_4$; $N_2O$, $SiH_4$, $NH_3$ and $N_2$; $SiH_4$, $NH_3$ and $N_2$ or $SiH_2Cl_2$, $NH_3$ and $N_2$, where the range of the gas reaction ratio of $N_2O$ to $SiH_4$ is from 100:1 to 50:1.

By using the electrode lead-out structure having the overlapped structure and the range of the overlap radius, the permeation of water and oxygen may be effectively prevented, and the structure of TFTs will not be largely influenced; moreover, in a preparation method for such structure, without changing the preparation method, it is only required to correspondingly modify the exposure sizes of mask plates for forming the source 6, the drain 7 and the pixel electrode 9.

Accordingly, the preparation method of the array substrate provided in this embodiment specifically includes the following steps.

Step 1: A gate metal film having a thickness ranging from 2000 Å to 5000 Å is deposited on a transparent substrate or quartz 1 by sputtering or heat evaporation, and the metal gate film is formed into a pattern including a gate 2 and a gate line (not shown in FIG. 5) by a patterning process. The gate 2 may be made of Cr, W, Ti, Ta, Mo or other metals or alloys, and may be of a single-layer or multilayer structure.

Step 2: A gate insulating layer film having a thickness ranging from 2000 Å to 5000 Å is continuously deposited on the substrate after step 1 by PECVD method so as to form a gate insulating layer 3. The gate insulating layer 3 may be of a single-layer or multilayer structure, and may be made of silicon-rich material, wherein the silicon-rich material includes silicon oxide, silicon nitride or silicon oxynitride. Specifically, the gate insulating layer 3 may be of a single-layer structure made of silicon oxide, a composite structure made of silicon nitride and silicon oxide, or a three-layer structure made of silicon nitride/silicon oxynitride/silicon oxide. The corresponding reactant gases of silicon oxide, silicon oxynitride and silicon nitride may be $N_2O$ and $SiH_4$; $N_2O$, $SiH_4$, $NH_3$ and $N_2$; $SiH_4$, $NH_3$ and $N_2$ or $SiH_2Cl_2$, $NH_3$ and $N_2$. The silicon oxide film employed in this embodiment is of a silicon-rich structure containing many Si dangling bonds, and is formed mainly by adjusting the reaction ratio of the gases. For the silicon oxide of a silicon-rich structure, the gas reaction ratio of $N_2O$ to $SiH_4$ is larger than 50:1; meanwhile, considering the performance of the silicon oxide film, the ratio is less than 100:1. That is, the range of the gas reaction ratio of $N_2O$ to $SiH_4$ is from 100:1 to 50:1.

Then, a metal oxide semiconductor layer having a thickness ranging from 50 Å to 1000 Å is continuously deposited by sputtering. The metal oxide semiconductor may be IGZO, amorphous IGZO, HIZO, IZO, a-InZnO, amorphous a-InZnO, ZnO:F, $In_2O_3$:Sn, $In_2O_3$:Mo, $Cd_2SnO_4$, ZnO:Al, $TiO_2$:Nb, Cd—Sn—O or other metal oxides. A pattern including the active layer 4 is formed by using the metal oxide semiconductor layer by a patterning process.

Step 3: An etching barrier layer film having a thickness ranging from 500 Å to 3000 Å is deposited on the substrate after step 2 by PECVD method. The etching barrier layer film may be of a single-layer or multilayer structure, and is made of silicon-rich material, wherein the silicon-rich material includes silicon oxide, silicon nitride or silicon oxynitride. Specifically, the etching barrier layer film may be of a single-layer structure made of silicon oxide, a composite structure made of silicon nitride and silicon oxide, or a three-layer structure made of silicon nitride/silicon oxynitride/silicon oxide. The corresponding reactant gases of silicon oxide, silicon oxynitride and silicon nitride may be $N_2O$ and $SiH_4$; $N_2O$, $SiH_4$, $NH_3$ and $N_2$; $SiH_4$, $NH_3$ and $N_2$ or $SiH_2Cl_2$, $NH_3$ and $N_2$. The silicon oxide film employed in this embodiment is of a silicon-rich structure containing many Si dangling bonds, and is formed mainly by adjusting the reaction ratio of the gases. For the silicon oxide of a silicon-rich structure, the gas reaction ratio of $N_2O$ to $SiH_4$ is larger than 50:1; meanwhile, considering the performance of the silicon oxide film, the ratio is less than 100:1. That is, the range of the gas reaction ratio of $N_2O$ to $SiH_4$ is from 100:1 to 50:1. Then, a pattern including an etching barrier layer 5 and etching barrier layer vias is formed by using the etching barrier layer film by a patterning process, wherein the etching barrier layer vias include a first etching barrier layer via 51 (for connecting the active layer 4 to the source 6) and a second etching barrier layer via 52 (for connecting the active layer 4 to the drain 7).

Of course, the etching barrier layer 5 may be of a single-layer structure made of $Al_2O_3$, or a double-layer composite structure made of $SiO_x/SiNO$, $SiO_x/SiN_x$ or $Al_2O_3/SiN_x$.

Step 4: A source/drain metal layer is deposited on the substrate after step 3 by sputtering or heat evaporation. The source/drain metal layer may be made of Cr, W, Ti, Ta, Mo or other metals or alloys, and may be deposited in a single-layer or multilayer structure. Then, a pattern including the source 6, the drain 7 and a data line (not shown in FIG. 5) is formed by using the source/drain metal layer by a patterning process, wherein the formed source 6 covers the wall and the bottom of the first etching barrier layer via 51 and comes into contact with the active layer 4, and the formed drain 7 covers the wall and bottom of the second etching barrier layer via 52 and comes into contact with the active layer 4. Meanwhile, the source 6 extends from the upper edge of the first etching barrier layer via 51 along the upper surface of the etching barrier layer 5 to overlap with the upper surface of the etching barrier layer 5; and/or, the drain 7 extends from the upper edge of the second etching barrier layer via 52 along the upper surface of the etching barrier layer 5 to overlap with the upper surface of the etching barrier layer 5.

Step 5: A passivation film having a thickness ranging from 2000 Å to 10000 Å is deposited on the glass substrate after step 4 by PECVD method. The passivation film may be of a single-layer or multilayer structure, and is made of silicon-rich material, wherein the silicon-rich material includes silicon oxide, silicon nitride or silicon oxynitride. Specifically, the passivation film may be of a single-layer structure made of silicon oxide, a composite structure made of silicon nitride and silicon oxide, or a three-layer structure made of silicon nitride/silicon oxynitride/silicon oxide. The corresponding reactant gases of silicon oxide, silicon oxynitride and silicon nitride may be $N_2O$ and $SiH_4$; $N_2O$, $SiH_4$, $NH_3$ and $N_2$; $SiH_4$, $NH_3$ and $N_2$ or $SiH_2Cl_2$, $NH_3$ and $N_2$. The silicon oxide film employed in this embodiment is of a silicon-rich structure containing many Si dangling bonds, and is formed mainly by adjusting the reaction ratio of the gases. For the silicon oxide of a silicon-rich structure, the gas reaction ratio of $N_2O$ to $SiH_4$ is larger than 50:1; meanwhile, considering the performance of the silicon oxide film, the ratio is less than 100:1. That is, the range of the gas reaction ratio of $N_2O$ to $SiH_4$ is from 100:1 to 50:1. Then, a pattern including a passivation layer 8 and a via 81 of the passivation layer is formed by using the passivation film by a patterning process.

Step 6: A transparent conducting layer having a thickness ranging from 300 Å to 1500 Å is deposited on the substrate after step 5 by sputtering or heat evaporation. The transparent conducting layer may be ITO, IZO or other transparent metal oxides. A pattern including a pixel electrode 9 is formed by using the transparent conducting layer by a patterning process. The pixel electrode 9 in this embodiment is plate-shaped. The pixel electrode 9 covers the wall and the bottom of the via 81 of the passivation layer and comes into contact with the drain 7, and pixel electrode 9 extends from the upper edge of the via 81 of the passivation layer along the upper surface of the passivation layer 8 to overlap with the upper surface of the passivation layer 8.

The array substrate provided by this embodiment is suitable for liquid crystal display devices of a TN (Twisted Nematic) mode or a VA (Vertical Alignment) mode. Or, the pixel electrode 9 is used as the anode or cathode of an OLED, thereby forming an OLED display device.

In the array substrate provided by this embodiment, a plurality of electrode lead-out structures provided in Embodiment 1 may be employed to prevent the permeation of water and oxygen layer by layer, so that a better sealing effect to the metal oxide semiconductor of the active layer 4 may be achieved, and the stability of TFTs is ensured.

Embodiment 3

This embodiment provides an array substrate. In addition to the substrate in Embodiment 1, the array substrate further includes a common electrode disposed on the substrate.

Figure 6:
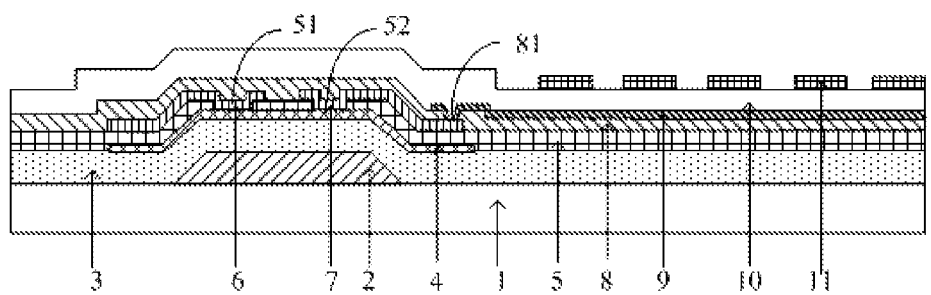
FIG. 6 is a sectional view of a display region of an array substrate in Embodiment 3 of the present invention.

Specifically, as shown in FIG. 6, in the array substrate provided by this embodiment, a protection layer 10 is further provided above the pixel electrode 9, and a common electrode 11 is provided above the protection layer 10. The common electrode 11 includes a plurality of electrode bars arranged at intervals, the space between adjacent electrode bars is a slit, and the common electrode 11 is at least partially overlapped with the pixel electrode 9 in the direction of an orthographic projection.

The protection layer 10 is generally made of transparent material (silicon oxides, silicon nitrides, hafnium oxides, silicon oxynitrides or aluminum oxides). The common electrode 11 is generally made of transparent ITO, IZO, or other transparent metal oxides. During the formation of the common electrode 11, a transparent conducting layer having a thickness ranging from 100 Å to 2000 Å is deposited by spluttering or heat evaporation, and then a pattern including the common electrode 11 is formed by a patterning process.

The array substrate provided by this embodiment is suitable for liquid crystal display devices of a plane electric field wide-angle core technology-advanced super dimension switch (ADSDS or ADS for shot) mode. The characteristics of the core technology are described as follows: a multidimensional electric field is formed by an electric field generated by edges of slit electrodes in a same plane and an electric field generated between a slit electrode layer and a plate-shaped electrode layer, so all liquid crystal molecules with various orientations between slit electrodes and just above the electrodes in a liquid crystal cell may be rotated, so that the working efficiency of liquid crystal is improved, and the light transmittance is enhanced. The advanced super dimension switch may improve the image quality of a TFT-LCD product, and has the advantages of high resolution, high transmittance, low power consumption, wide angle, high aperture ratio, low chromatic aberration, no push Mura and the like. In view of different applications, the improved technologies of the ADS technology include high transmittance I-ADS technology, high aperture ratio H-ADS technology, high resolution S-ADS technology and the like.

Embodiment 4

This embodiment provides an array substrate, in which the electrode lead-out structure provided by Embodiment 2 or Embodiment 3 may be employed in a display region. The electrode lead-out structure in the display region is similar to the structure in the embodiments described above, and will not be repeated here. This embodiment mainly discusses that the non-display region of the array substrate may also include the electrode lead-out structure shown by Embodiment 1. The electrode lead-out structure is a via lap joint of SD PAD or a SD region of a source connecting plate.

Figure 7:
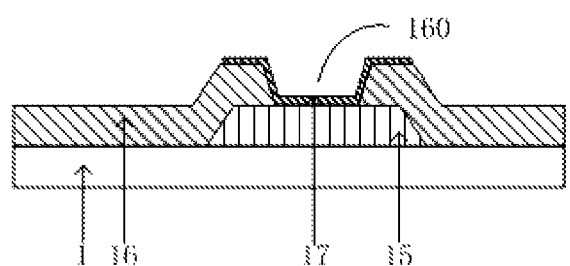
FIG. 7 is a sectional view of a via lap joint of an SD region of a non-display region of an array substrate in Embodiment 4 of the present invention.
Figure 8A:
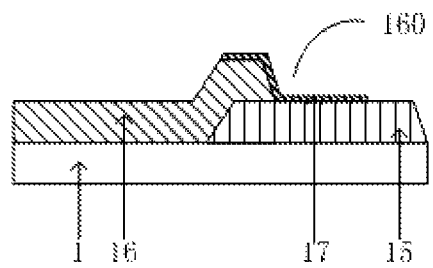
FIG. 8A and FIG. 8B are sectional views of an SD PAD region of a non-display region of an array substrate in Embodiment 4 of the present invention.
Figure 8B:
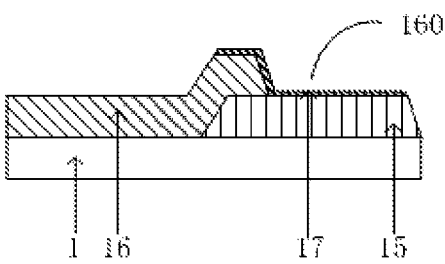

As shown in FIG. 7, FIG. 8A and FIG. 8B, an electrode connecting plate is provided in the non-display region of the array substrate, and the electrode connecting plate includes a wiring electrode 15 provided above the substrate 1 and an electrode protection layer 16 and a signal lead-out electrode 17 provided above the wiring electrode 15. In the electrode lead-out structure in the array substrate provided by this embodiment, the substrate electrode includes the wiring electrode 15, the lead-out electrode includes the signal lead-out electrode 17, and the isolating layer includes the electrode protection layer 16.

As shown in FIG. 7, the electrode protection layer 16 completely covers the wiring electrode 15, a via 160 of the electrode protection layer is formed in the electrode protection layer 16 to expose a part of region of the wiring electrode 15, and the signal lead-out electrode 17 covers the wall and the bottom of the via 160 of the electrode protection layer and comes into contact with the exposed region of the wiring electrode 15. The signal lead-out electrode 17 is arranged to extend from an upper edge of the via 160 of the electrode protection layer along an upper surface of the electrode protection layer 16 to overlap with the upper surface of the electrode protection layer 16. Wherein, a radius of a range in which the signal lead-out electrode 17 overlaps with the upper surface of the electrode protection layer 16 by extending from the upper edge of the via 160 of the electrode protection layer along the upper surface of the electrode protection layer 16 is 2-200 µm. Here, "completely cover" refers to that the electrode protection layer 16 covers all the exposed region of the wiring electrode 15 except the via 160 of the electrode protection layer, including an upper surface and a side wall of the wiring electrode 15.

The structure of the electrode connecting plate shown in FIG. 7 is generally called a via lap joint of an SD region. Compared with the case of the via lap joint of the SD region of the non-display region in the prior art shown in FIG. 1, the via lap joint of the SD region in the electrode lead-out structure provided by this embodiment shown in FIG. 7 has better effect of preventing the permeation of water and oxygen, so that the possibility of permeation of water and oxygen from clearances of the vias in the non-display region is eliminated, and the stability of TFTs in the array substrate is further improved.

Of course, as shown in FIG. 8A and FIG. 8B, the electrode protection layer 16 may also partially cover the wiring electrode 15 to expose a part of region of the wiring electrode 15 through a side wall at an end portion of the electrode protection layer 16. The signal lead-out electrode 17 covers the side wall of the electrode protection layer 16 to come into contact with the exposed region of the wiring electrode 15, and also extends from an upper edge of the side wall at the end portion of the electrode protection layer 16 along the upper surface of the electrode protection layer 16 to overlap with the upper surface of the electrode protection layer 16 and extends from a lower edge of the side wall at the end portion of the electrode protection layer 16 along the exposed region of the wiring electrode 15 to overlap with the exposed region of the wiring electrode 15 which is not covered by the electrode protection layer 16. Wherein, the overlapped structure shown in FIG. 8A does not extend to the edge of the wiring electrode 15, while the overlapped structure shown in FIG. 8B extends to the edge of the wiring electrode 15. A radius of a range in which the signal lead-out electrode 17 overlaps with the upper surface of the electrode protection layer 16 by extending from the wall at the end portion of the electrode protection layer 16 along the upper surface of the electrode protection layer 16 is 2-200 µm.

Figure 2:
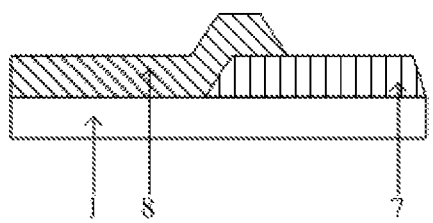
FIG. 2 is a sectional view of an SD PAD region of a non-display region in the prior art.

The structures of the electrode connecting plates shown in FIG. 8A and FIG. 8B are generally called SD PAD of a source connecting plate. Compared with the case of the SD PAD region of the non-display region in the prior art shown in FIG. 2, any one of the SD PAD structures having the electrode lead-out structure provided by this embodiment shown in FIG. 8A and FIG. 8B has better effect of preventing the permeation of water and oxygen, so that the possibility of permeation of water and oxygen from clearances the vias in the non-display region is eliminated, and the stability of TFTs in the display region of the array substrate is further improved.

In this embodiment, the wiring electrode 15 is formed by using the same material and in the same patterning process as the drain 7 in the display region, the signal lead-out electrode 17 is formed by using the same material and in the same patterning process as the pixel electrode 9, and the electrode protection layer 16 is formed by using the same material and in the same patterning process as the passivation layer 8. As the transparent pixel electrode 9 is generally thin and its thickness is generally ranging from 300 Å-1500 Å, no new undesirable phenomenon will be generated between the pixel electrode and the electrode connecting plate due to offsets.

When the structure of the electrode connection plate (generally referred to as the via lap joint of the SD region) shown in FIG. 7 in the preparation process of the array substrate, the wiring electrode 15 is formed in the non-display region by using the same material and in the same patterning process while forming the drain 7; while forming the passivation layer 8, the electrode protection layer 16 is formed by extending the passivation layer 8 to the non-display region, and the via 160 of the electrode protection layer is formed in the electrode protection layer 16 corresponding to the wiring electrode 15 to expose a part of the wiring electrode 15; then, while forming the pixel electrode 9, the transparent signal lead-out electrode 17 is formed in the non-display region to lap-joint the wiring electrode 15, wherein the signal lead-out electrode 17 and the electrode protection layer 16 form a certain overlap radius, for example, 2 µm-200 µm (single edge).

According to the above formation process of the via lap joint of the SD region and the existing patterning process knowledge, it can be inferred that during the preparation of SD PAD shown in FIG. 8A and FIG. 8B, the difference between the lap-joint manner shown in FIG. 8A and FIG. 8B and the lap-joint manner shown in FIG. 7 is that, to coordinate with the connection of an external circuit, the SD PAD is designed to be in a single-edge overlapping manner (may be regarded as a via having an infinitely-great radius or a via equivalent to a single edge) and located in an SD PAD region according to the circuit design requirements.

In this embodiment, by improving the via lap joint portion of the SD region and the structure of the SD PAD region in the non-display region, the influences of outside water and oxygen on metal oxide semiconductor TFTs may be effectively solved.

Embodiment 5

This embodiment provides an array substrate, in which the electrode lead-out structure provided by Embodiment 2 or Embodiment 3 may be employed in a display region. The electrode lead-out structure in the display region is similar to the structure in the embodiments described above, and will not be repeated here. This embodiment mainly discusses that the non-display region of the array substrate may also include the electrode lead-out structure shown by Embodiment 1. The electrode lead-out structure is a gate connecting plate Gate PAD or a via lap joint portion of a Gate region.

Figure 9A:
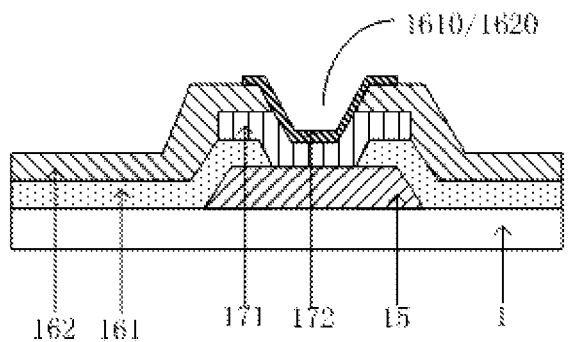
FIG. 9A and FIG. 9B are sectional views of a via lap joint of a Gate region of a non-display region of an array substrate in Embodiment 5 of the present invention.
Figure 9B:
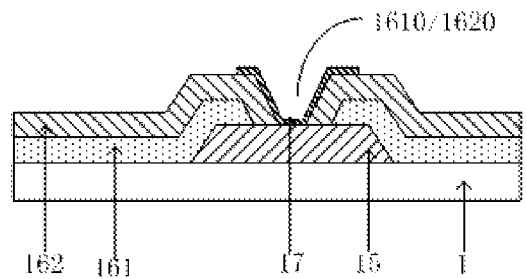

As shown in FIG. 9A and FIG. 9B, an electrode connecting plate is provided in the non-display region of the array substrate, and the electrode connecting plate includes a wiring electrode 15 provided above the substrate 1, and a first electrode protection layer 161, a second electrode protection layer 162, first signal lead-out electrode 171 and a second signal lead-out electrode 172 which all are provided above the wiring electrode 15. In the electrode lead-out structure provided by this embodiment, the substrate electrode includes the wiring electrode 15, the lead-out electrode includes the first signal lead-out electrode 171 and the second signal lead-out electrode 172, and the isolating layer includes the first electrode protection layer 161 and the second electrode protection layer 162.

As shown in FIG. 9A, the first electrode protection layer 161 completely covers the wiring electrode 15, and a via 1610 of the first electrode protection layer is formed in the first electrode protection layer 161 to expose a part of region of the wiring electrode 15. The first signal lead-out electrode 171 covers the wall and bottom of the via 1610 of the first electrode protection layer and comes into contact with the exposed region of the wiring electrode 15. The first signal lead-out electrode 171 extends from an upper edge of the via 1610 of the first electrode protection layer along an upper surface of the first electrode protection layer 161 to overlap with the upper surface of the first electrode protection layer 161. The second electrode protection layer 162 completely covers the first signal lead-out electrode 171, and a via 1620 of the second electrode protection layer is formed in the second electrode protection layer 162 to expose a part of region of the first signal lead-out electrode 171. The second signal lead-out electrode 172 covers the wall and bottom of the via 1620 of the second electrode protection layer and comes into contact with the exposed region of the first signal lead-out electrode 171. The second signal lead-out electrode 172 extends from an upper edge of the via 1620 of the second electrode protection layer 162 along the upper surface of the second electrode protection layer 162 to overlap with the upper surface of the second electrode protection layer 162. Here, "completely cover" refers to that the first electrode protection layer 161 covers all the exposed region of the wiring electrode 15 except the via 1610 of the first electrode protection layer, and the second electrode protection layer 162 covers all the exposed region of the first signal lead-out electrode 171 except the via 1620 of the second electrode protection layer.

A radius of a range in which the first signal lead-out electrode 171 overlaps with the upper surface of the first electrode protection layer 161 by extending from the upper edge of the via 1610 of the first electrode protection layer along the upper surface of the first electrode protection layer 161 is 2-200 µm; and a radius of a range in which the second signal lead-out electrode 172 overlaps with the upper surface of the second electrode protection layer 162 by extending from the upper edge of the via 1620 of the second electrode protection layer along the upper surface of the second electrode protection layer 162 is 2-200 µm.

Of course, as shown in FIG. 9B, the first signal lead-out electrode in FIG. 9A may also be omitted. That is, the first electrode protection layer 161 completely covers the wiring electrode 15, and a via 1610 of the first electrode protection layer is formed in the first electrode protection layer 161 to expose a part of region of the wiring electrode 15. The second electrode protection layer 162 completely covers the first electrode protection layer 161 and the wall and the bottom of the via 1610 of the first electrode protection layer, and a via 1620 of the second electrode protection layer is formed at a position of the second electrode protection layer 162 corresponding to the via 1610 of the first electrode protection layer to expose a part of region of the wiring electrode 15. The signal lead-out electrode 17 covers the wall and the bottom of the via 1620 of the second electrode protection layer and comes into contact with the exposed region of the wiring electrode 15. The signal lead-out electrode 17 is arranged to extend from the upper edge of the via 1620 of the second electrode protection layer along the upper surface of the second electrode protection layer 162 to overlap with the upper surface of the second electrode protection layer 162.

Figure 3:
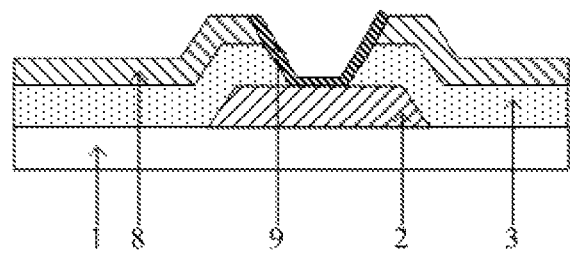
FIG. 3 is a sectional view of a via lap joint of a Gate region of a non-display region in the prior art.

The structures of the electrode connecting plates shown in FIG. 9A and FIG. 9B are generally called a via lap joint portion of a Gate region. Compared with the case of the via lap joint of the Gate region of the non-display region in the prior art shown in FIG. 3, any one of the via lap joint structures of the Gate region of the non-display region having the electrode lead-out structure provided by this embodiment shown in FIG. 9A and FIG. 9B has better effect of preventing the permeation of water and oxygen, so that the possibility of permeation of water and oxygen from clearances of the vias in the non-display region is eliminated, and the stability of TFTs in the array substrate is further improved. According to the design requirements of the array substrate, the array substrate may be protected by using any one manner or a combination of the two manners, thereby achieving a better effect of blocking outside water and oxygen.

Figure 10:
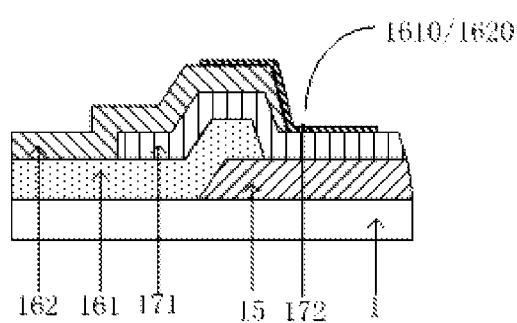
FIG. 10 is a sectional view of a Gate PAD region of a non-display region of an array substrate in Embodiment 5 of the present invention.

As shown in FIG. 10, the first electrode protection layer 161 partially covers the wiring electrode 15, and the first signal lead-out electrode 171 is disposed above the first electrode protection layer 161 and covers the side wall at the end portion of the first electrode protection layer 161 to come into contact with the wiring electrode 15. The first signal lead-out electrode 171 also extends from the upper edge of the side wall at the end portion of the first electrode protection layer 161 along the upper surface of the first electrode protection layer 161 to overlap with the upper surface of the first electrode protection layer 161, and extends from the lower edge of the side wall at the end portion of the first electrode protection layer 161 along a region of the wiring electrode 15, which is not covered by the first electrode protection layer 161, to overlap with the wiring electrode 15. Meanwhile, the second electrode protection layer 162 partially covers the first signal lead-out electrode 171, and the second signal lead-out electrode 172 is disposed above the second electrode protection layer 162 and covers the side wall of the second electrode protection layer 162 to come into contact with the first signal lead-out electrode 171. The second signal lead-out electrode 172 also extends from the upper edge of the side wall at the end portion of the second electrode protection layer 162 along the upper surface of the second electrode protection layer 162 to overlap with the upper surface of the second electrode protection layer 162, and extends from the lower edge of the side wall at the end portion of the second electrode protection layer 162 along a region of the first signal lead-out electrode 171, which is not covered by the second electrode protection layer 162, to overlap with the first signal lead-out electrode 171.

Wherein, a radius of a range in which the first signal lead-out electrode 171 overlaps with the upper surface of the first electrode protection layer 161 by extending from the upper edge of the wall at the end portion of the first electrode protection layer 161 along the upper surface of the first electrode protection layer 161 is 2-200 µm; and/or, a radius of a range in which the second signal lead-out electrode 172 overlaps with the upper surface of the second electrode protection layer 162 by extending from the upper edge of the wall at the end portion of the second electrode protection layer 162 along the upper surface of the second electrode protection layer 162 is 2-200 μm.

Figure 4:
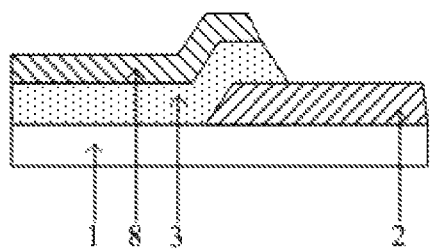
FIG. 4 is a sectional view of a Gate PAD region of a non-display region in the prior art.

The structure of the electrode connecting plate shown in FIG. 10 is generally called a Gate PAD region. Compared with the case of the Gate PAD region of the non-display region in the prior art shown in FIG. 4, the Gate PAD region structure of the non-display region having the electrode lead-out structure provided by this embodiment shown in FIG. 10 has better effect of preventing the permeation of water and oxygen, so that the possibility of permeation of water and oxygen from clearances of the vias in the non-display region is eliminated, and the stability of TFTs in the array substrate is further improved.

In this embodiment, the wiring electrode 15 is formed by using the same material and in the same patterning process as the gate 2; the first signal lead-out electrode 171 is formed by using the same material and in the same patterning process as the drain 7; the second signal lead-out electrode 172 is formed by using the same material and in the same patterning process as the pixel electrode 9; the first electrode protection layer 161 is formed by the same material and in the same patterning process as the gate insulating layer 3; and the second electrode protection layer 162 is formed by using the same material and in the same patterning process as the passivation layer 8.

When the structure of the electrode connection plate (generally referred to as the via lap joint of the Gate region) shown in FIG. 9A is formed in the preparation process of the array substrate, the wiring electrode 15 is formed in the non-display region by using the same material and in the same patterning process while forming the gate 2; while forming the gate insulating layer 3, the gate insulating layer 3 extends to the non-display region to form the first electrode protection layer 161 for completely covering the wiring electrode 15, and the via 1610 of the first electrode protection layer is formed in the first electrode protection layer 161 corresponding to the wiring electrode 15, so that the first electrode protection layer 161 and the wiring electrode 15 still form a certain overlap radius, for example, 2 μm-200 μm (single edge); then, while forming the drain 7, a first signal lead-out electrode 171 is formed in the non-display region by using the same material and in the same patterning process to lap-joint the wiring electrode 15, wherein the first signal lead-out electrode 171 and the first electrode protection layer 161 form a certain overlap radius, for example, 2 μm-200 μm (single edge); while forming the passivation layer 8, the passivation layer 8 extends to the non-display region to form the second electrode protection layer 162 for completely covering the first signal lead-out electrode 171, and the via 1620 of the second electrode protection layer is formed in the second electrode protection layer 162 corresponding to the first signal lead-out electrode 171, so that the second electrode protection layer 162 and the first signal lead-out electrode 171 still form a certain overlap radius, for example, 2 μm-200 μm (single edge); then, while forming the pixel electrode 9, the transparent second signal lead-out electrode 172 is formed in the non-display region to lap-joint the first signal lead-out electrode 171, wherein the second signal lead-out electrode 172 and the second electrode protection layer 162 form a certain overlap radius, for example, 2 μm-200 μm (single edge).

According to the formation process of the via lap joint of the Gate region and the existing patterning process knowledge, it can be inferred that during the preparation of the structure of the electrode connecting plate shown in FIG. 9B, the difference between the preparation process shown in FIG. 9B and the preparation process shown in FIG. 9A is that the formation of the first signal lead-out electrode 171 may be omitted, that is, it is not required to form the first signal lead-out electrode 171 in the non-display region while forming the drain 7. It is also inferred that during the preparation of the structure of the electrode connecting plate (generally referred to as the gate connecting plate Gate PAD) shown in FIG. 10, the difference between the preparation process shown in FIG. 10 and the preparation processes shown in FIG. 9A and FIG. 9B is that, to coordinate with the connection of an external circuit, the Gate PAD region is designed to be in a single-edge overlapping manner (may be regarded as a via having an infinitely-great radius or a via equivalent to a single edge) and located in an Gate PAD region according to the circuit design requirements.

In this embodiment, by improving the via lap joint portion of the Gate region and the structure of the Gate PAD of the non-display region, the influences of outside water and oxygen on metal oxide semiconductor TFTs may be effectively solved.

In the array substrates provided by Embodiments 2-5, by using the electrode lead-out structure of an overlapped structure, as the overlapped structure allows the concentration gradient of water and oxygen to gradually become smaller from outside to inside in the structure, the influences of outside water and oxygen permeating inside the array substrate on metal oxides may be effectively avoided, the TFTs (Oxide TFTs) with active layers formed by using metal oxide semiconductor have more stable performance and higher reliability, and the stability of the array substrate is also increased. The array substrate is particularly suitable for large-size and high-resolution liquid crystal display devices and AM-OLED display devices.

Embodiment 6

A display device is provided, including the array substrate shown by any one of Embodiments 2-5.

Wherein, the display device provided by this embodiment may be widely applied in products of various sizes. These products may contain main electronic products in the present information society, such as liquid crystal TV sets, computers, mobile phones, PDA, GPS, vehicle-mounted displays, projection displays, cameras, digital cameras, electronic watches, calculators, electronic instruments, instruments, public displays, virtual displays, and so on.

In the display device provided by this embodiment, as the array substrate having an electrode lead-out structure of an overlapped structure is employed, the performance is more stable and the display effect is better.

It should be understood that, the implementations described above are merely exemplary implementations for describing the principle of the present invention, but the present invention is not limited thereto. A person of ordinary skill in the art may make various variations and improvements without departing from the spirit and essence of the present invention, and these variations and improvements shall be deemed as falling into the protection scope of the present invention.

The invention claimed is:

1. An electrode lead-out structure, comprising a substrate electrode, an isolating layer and an lead-out electrode, the isolating layer covering the substrate electrode in such a manner that a region of the substrate electrode is not covered by the isolating layer, the lead-out electrode being in contact with the substrate electrode through the region of the substrate electrode not covered by the isolating layer, wherein:
- the isolating layer only covers a first end of the substrate electrode and does not cover a second end of the substrate electrode distal to the first end of the substrate electrode; and
- the lead-out electrode covers a side wall of an end portion of the isolating layer, and the lead-out electrode also extends from an upper edge of the side wall of the end portion of the isolating layer along an upper surface of the isolating layer to overlap with the upper surface of the isolating layer and extends, without exceeding the region of the substrate electrode not covered by the isolating layer, from a lower edge of the side wall of the end portion of the isolating layer along the region of the substrate electrode not covered by the isolating layer so as to overlap only with a portion of the region of the substrate electrode not covered by the isolating layer while not overlapping with remaining portion of the region of the substrate electrode not covered by the isolating layer, such that a first end of the lead-out electrode covering the end portion of the isolating layer has a stepped shape, and a second end of the lead-out electrode distal to the first end of the lead-out electrode has a flat shape, the second end of the lead-out electrode extending from the lower edge of the side wall of the end portion of the isolating layer along the region of the substrate electrode not covered by the isolating layer.

2. The electrode lead-out structure according to claim 1, wherein a radius of a range in which the lead-out electrode overlaps with the upper surface of the isolating layer by extending from the upper edge of the side wall of the end portion of the isolating layer along the upper surface of the isolating layer is 0.2-200 μm.

3. An array substrate, comprising a substrate and an electrode lead-out structure disposed on the substrate, wherein the electrode lead-out structure employs the electrode lead-out structure according to claim 1.

4. The array substrate according to claim 3, wherein a radius of a range in which the lead-out electrode overlaps with the upper surface of the isolating layer by extending from the upper edge of the side wall of the end portion of the isolating layer along the upper surface of the isolating layer is 0.2-200 μm.

5. The array substrate according to claim 3, wherein the array substrate comprises a display region and a non-display region, and the electrode lead-out structure is disposed in the display region or non-display region of the array substrate.

6. The array substrate according to claim 5, wherein an electrode connecting plate is provided within the non-display region, the electrode connecting plate comprising a wiring electrode, an electrode protection layer and a signal lead-out electrode, the substrate electrode being formed as the wiring electrode, the lead-out electrode being formed as the signal lead-out electrode, the isolating layer being formed as the electrode protection layer, the electrode protection layer covering the wiring electrode in such a manner that a part of region of the wiring electrode is not covered by the electrode protection layer, the signal lead-out electrode being in contact with the wiring electrode through the region of the wiring electrode not covered by the electrode protection layer;
- wherein, the signal lead-out electrode covers the side wall of the end portion of the electrode protection layer, and the signal lead-out electrode also extends from an upper edge of the side wall of the end portion of the electrode protection layer along an upper surface of the electrode protection layer to overlap with the upper surface of the electrode protection layer, and extends from a lower edge of the side wall of the end portion of the electrode protection layer along the region of the wiring electrode not covered by the electrode protection layer to overlap with the region of the wiring electrode.

7. The array substrate according to claim 6, wherein a radius of a range in which the signal lead-out electrode overlaps with the upper surface of the electrode protection layer by extending from the upper edge of the side wall of the end portion of the electrode protection layer along the upper surface of the electrode protection layer is 2-200 μm.

8. The array substrate according to claim 6, wherein the wiring electrode is formed by using a same material and in a same patterning process as the drain, the signal lead-out electrode is formed by using a same material and in a same patterning process as the pixel electrode, and the electrode protection layer is formed by using a same material and in a same patterning process as a passivation layer.

9. The array substrate according to claim 6, wherein the electrode protection layer comprises a first electrode protection layer and a second electrode protection layer, and the signal lead-out electrode comprises a first signal lead-out electrode and a second signal lead-out electrode;
- wherein, the first electrode protection layer covers the wiring electrode in such a manner that a part of region of the wiring electrode is not covered by the first electrode protection layer, the first signal lead-out electrode being in contact with the wiring electrode through the region of the wiring electrode not covered by the first electrode protection layer, the first signal lead-out electrode covering the side wall of the end portion of the first electrode protection layer, the first signal lead-out electrode also extending from an upper edge of the side wall of the end portion of the first electrode protection layer along an upper surface of the first electrode protection layer to overlap with the upper surface of the first electrode protection layer, and extending from a lower edge of the side wall of the end portion of the first electrode protection layer along the region of the wiring electrode not covered by the first electrode protection layer to overlap with the region of the wiring electrode not covered by the first electrode protection layer; and the second electrode protection layer covers the first signal lead-out electrode in such a manner that a part of region of the first signal lead-out electrode is not covered by the second electrode protection layer, the second signal lead-out electrode being in contact with the first signal lead-out electrode through the region of the first signal lead-out electrode not covered by the second electrode protection layer, the second signal lead-out electrode covering the side wall of the end portion of the second electrode protection layer, the second signal lead-out electrode also extending from an upper edge of the side wall of the end portion of the second electrode protection layer along an upper surface of the second electrode protection layer to overlap with the upper surface of the second electrode protection layer, and extending from a lower edge of the side wall of the end portion of the second electrode protection layer along the region of the first signal lead-out electrode not covered by the second electrode protection layer to overlap with the region of the first signal lead-out electrode not covered by the second electrode protection layer.

10. The array substrate according to claim 9, wherein a radius of a range in which the first signal lead-out electrode overlaps with the upper surface of the first electrode protection layer by extending from the upper edge of the wall at the end portion of the first electrode protection layer along the upper surface of the first electrode protection layer and a radius of a range in which the second signal lead-out electrode overlaps with the upper surface of the second electrode protection layer by extending from the upper edge of the wall at the end portion of the second electrode protection layer along the upper surface of the second electrode protection layer are both 2-200 µm.

11. The array substrate according to claim 9, wherein the wiring electrode is formed by using a same material and in a same patterning process as the gate, the first signal lead-out electrode is formed by using a same material and in a same patterning process as the drain, the second signal lead-out electrode is formed by using a same material and in a same patterning process as the pixel electrode, the first electrode protection layer is formed by a same material and in a same patterning process as the gate insulating layer, and the second electrode protection layer is formed by using a same material and in a same patterning process as the passivation layer.

12. A display device, comprising the array substrate according to claim 3.

* * * * *